US010504236B2

(12) United States Patent
Killelea et al.

(10) Patent No.: US 10,504,236 B2
(45) Date of Patent: Dec. 10, 2019

(54) TESTING A BATTERY

(71) Applicant: THE BOEING COMPANY, Chicago, IL (US)

(72) Inventors: Elizabeth Killelea, Huntsville, AL (US); Joseph Gonzalez, Huntsville, AL (US); Jan Wei Pan, Madison, AL (US)

(73) Assignee: The Boeing Company, Chicago, IL (US)

( * ) Notice: Subject to any disclaimer, the term of this patent is extended or adjusted under 35 U.S.C. 154(b) by 161 days.

(21) Appl. No.: 15/864,748

(22) Filed: Jan. 8, 2018

(65) Prior Publication Data

US 2019/0213750 A1    Jul. 11, 2019

(51) Int. Cl.
| *G06K 9/00* | (2006.01) |
| *G06T 7/62* | (2017.01) |
| *G01B 11/02* | (2006.01) |
| *G06T 7/269* | (2017.01) |
| *G06T 7/70* | (2017.01) |

(Continued)

(52) U.S. Cl.
CPC .............. *G06T 7/62* (2017.01); *G01B 11/022* (2013.01); *G01R 31/385* (2019.01); *G06K 9/481* (2013.01); *G06K 9/6218* (2013.01); *G06T 7/269* (2017.01); *G06T 7/70* (2017.01); *H01M 6/5083* (2013.01); *H01M 10/4285* (2013.01); *H04N 1/40012* (2013.01); *G06K 2009/487* (2013.01); *G06T 2207/10016* (2013.01); *G06T 2210/12* (2013.01)

(58) Field of Classification Search
CPC .. G06T 7/62; G06T 7/70; G06T 7/269; G06T 2210/12; G06T 2207/10016; G01R 31/385; G06K 9/481; G06K 9/6218; G06K 2009/487; H01M 6/5083; H01M 10/4285; G01B 11/022
See application file for complete search history.

(56) References Cited

U.S. PATENT DOCUMENTS

| 6,526,361 B1 * | 2/2003 | Jones .................... G01R 31/36 702/63 |
| 7,541,938 B1 * | 6/2009 | Engelhaupt ............ G08B 17/12 250/339.13 |

(Continued)

OTHER PUBLICATIONS

European Search Report dated Mar. 22, 2019; European Application No. 19150590.8-1210.

(Continued)

*Primary Examiner* — John B Strege
(74) *Attorney, Agent, or Firm* — Womble Bond Dickinson (US) LLP

(57) ABSTRACT

A method of testing a battery includes causing a battery in a test environment to produce a fire having a flame that extends out from the battery, and capturing a digital image of a scene that includes at least a portion of a test environment and the flame, the digital image being formed using visible light. The method includes uploading the digital image to a computer configured to produce a quiver plot and identify points on the quiver plot that define a polygon that is an approximate outline of the flame. The computer is configured to determine dimensions of the polygon, and translate the dimensions from the quiver plot to the digital image, and from the digital image to dimensions of the flame in the scene. And the computer is configured to generate a displayable report that includes at least the dimensions of the flame.

24 Claims, 7 Drawing Sheets

(51) Int. Cl.
  *H04N 1/40*    (2006.01)
  *G06K 9/62*    (2006.01)
  *H01M 10/42*   (2006.01)
  *H01M 6/50*    (2006.01)
  *G06K 9/48*    (2006.01)
  *G01R 31/385*  (2019.01)

(56) References Cited

U.S. PATENT DOCUMENTS

| | | | | |
|---|---|---|---|---|
| 2009/0136115 | A1* | 5/2009 | Sotooka | G01N 21/95684 |
| | | | | 382/141 |
| 2010/0104928 | A1 | 4/2010 | Nishino | |
| 2011/0085030 | A1* | 4/2011 | Poe | F23G 5/50 |
| | | | | 348/61 |
| 2014/0346894 | A1* | 11/2014 | Csicsay | H01M 10/48 |
| | | | | 307/116 |
| 2014/0374475 | A1* | 12/2014 | Kallfelz | H04Q 9/00 |
| | | | | 235/375 |
| 2016/0266212 | A1* | 9/2016 | Carlo | G06K 9/18 |
| 2017/0125782 | A1* | 5/2017 | Liu | H01M 2/34 |
| 2018/0019497 | A1* | 1/2018 | Lin | H01M 10/0565 |

OTHER PUBLICATIONS

Chen Mingy et al., "Experimental Study on the Combustion Characteristics of Primary Lithium Batteries Fire", Fire Technology, vol. 25, No. 2, Dec. 9, 2014, pp. 365-385.

Martin Mueller et al., "Optical Flow Estimation for Flame Detection in Videos", IEEE Transactions on Image Processing, vol. 22, No. 7, Jul. 1, 2013, pp. 2786-2797.

Tuan Qiu et al., "An Autoadaptive Edge-Dectection Algorithm for Flame and Fire Image Processing", IEEE Transactions on Image Processing, vol. 61, No. 5, May 1, 2012, pp. 1486-1493.

Ryan. "Evaluation of a Passive Flame-Height Sensor To Estimate Forest Fire Intensity". US Department of Ariculture, Jun. 1981,.14 pgs.

Xue et al. "Refraction Wiggles for Measuring Fluid Depth and Velocity from Video". European Conference on Computer Vision. Springer, Cham, 2014. 16 pgs.

* cited by examiner

TESTING A BATTERY

TECHNOLOGICAL FIELD

The present disclosure relates generally to battery testing and, in particular, to battery testing including analysis of a digital image of a scene that includes the battery and a flame produced by the battery during the test.

BACKGROUND

Many industries that manufacture or use batteries conduct testing and certification of those batteries before they are put in service. In a number of these tests, a battery is punctured or heated to cause the battery to produce a fire having a flame. The fire may be characterized by the flame's length, width and angle, its velocity, and/or its duration. This characterization may then be used to draw conclusions about the battery's quality, safety risks and use feasibility.

In current battery testing techniques, a flame's dimensions, velocity and duration are manually extracted from images or video. These current techniques can only capture the visible flame (continuous flame and intermittent flame) but not the heat released by the flame (buoyant plume), which currently requires a thermal camera to capture or view. In addition to being expensive, thermal cameras have many limitations. These cameras are generally incapable of capturing images or video through most types of glass and clear materials that are often used to isolate the test environment. A thermal camera could be placed in the test environment or otherwise in close proximity to the battery under test, but at the undesirable risk of damaging the expensive equipment or negatively influencing the experiment.

Therefore, it would be desirable to have a system and method that takes into account at least some of the issues discussed above, as well as other possible issues.

BRIEF SUMMARY

Example implementations of the present disclosure are directed to an improved method of testing a battery using a digital camera that forms images or video using visible light. This type of camera is generally less expensive than a thermal camera, and many are capable of capturing images or video through glass and clear materials that may be used to isolate the test environment. Example implementations also provide automated analysis of the images or video that captures not only the visible flame (continuous flame and intermittent flame), but also the heat released by the flame (buoyant plume). Example implementations enable a better understanding of all parts of a flame at the same time with reduced user input and no additional sensors or instruments in the testing environment.

The present disclosure thus includes, without limitation, the following example implementations.

Some example implementations provide a method of testing a battery comprising setting up the battery in a test environment; puncturing or heating the battery in the test environment to cause the battery to produce a fire having a flame that extends out from the battery; capturing a digital image of a scene that includes at least a portion of the test environment and the flame that extends out from the battery, the digital image being captured using a digital camera that forms the digital image using visible light where the digital camera is positioned external to the test environment; and uploading the digital image of the scene to a computer configured to determine dimensions of the flame in the scene based thereon, including the computer being configured to at least: produce a quiver plot of the scene from the digital image, the quiver plot including a plurality of velocity vectors that represent motion of gases in the scene, the motion of gases including motion of gases in and around the flame, the plurality of velocity vectors originating at a respective plurality of points in the quiver plot and having respective magnitudes and directions; identify a point of the respective plurality of points as an origin point to represent an origin of the flame in the scene; select or receive selection of other points of the respective plurality of points based on similarity of at least the directions of the velocity vectors originating at the origin point and the other points, the origin point and the other points defining a polygon in the quiver plot that is an approximate outline of the flame; determine dimensions of the polygon in the quiver plot; translate the dimensions of the polygon in the quiver plot to corresponding dimensions of a polygon in the digital image; translate the corresponding dimensions of the polygon in the digital image to dimensions of the flame in the scene; and generate a displayable report that includes at least the dimensions of the flame.

In some example implementations of the method of any preceding example implementation, or any combination of preceding example implementations, setting up the battery in the test environment includes setting up the battery between the digital camera and a fixed background within a back region of the test environment, and the digital image of the scene includes at least a portion of the fixed background and the flame that extends out from the battery.

In some example implementations of the method of any preceding example implementation, or any combination of preceding example implementations, uploading the digital image of the scene to the computer includes uploading the digital image of the scene to the computer configured to further convert the digital image from color to black-and-white before the quiver plot is produced from the digital image.

In some example implementations of the method of any preceding example implementation, or any combination of preceding example implementations, uploading the digital image of the scene to the computer includes uploading the digital image of the scene to the computer configured to further identify as abnormal any velocity vectors of the plurality of velocity vectors based on at least a threshold dissimilarity of at least the directions of the velocity vectors and neighboring velocity vectors in the quiver plot; construct new velocity vectors for the velocity vectors identified as abnormal from an interpolation of the neighboring velocity vectors; and replace the velocity vectors identified as abnormal with the new velocity vectors, the velocity vectors identified as abnormal being replaced before the origin point is identified and the other points are selected.

In some example implementations of the method of any preceding example implementation, or any combination of preceding example implementations, the computer being configured to or receive selection of select the other points includes being configured to perform an iterative process in which a first iteration includes the computer being configured to at least identify for a point in the quiver plot that in the first iteration is the origin point, a velocity vector originating at a neighboring point that is most similar in at least direction to a velocity vector originating at the point; and select the neighboring point as one of the other points that defines the polygon in the quiver plot, wherein in each of at least some iterations of the iterative process after the first iteration, the point in the quiver plot is the neighboring point selected in an immediately preceding iteration, and the computer being configured to identify the velocity vector excludes the velocity vector originating at the point in the immediately preceding iteration.

In some example implementations of the method of any preceding example implementation, or any combination of preceding example implementations, the computer being configured to select or receive selection of the other points includes being configured to perform an iterative process in which a first iteration includes the computer being configured to at least identify for a point in the quiver plot that in the first iteration is the origin point, velocity vectors originating at neighboring points that have at least a threshold similarity of at least direction to a velocity vector originating at the point; and select the neighboring points as candidate points, wherein in each of at least some iterations of the iterative process after the first iteration, the computer being configured to identify velocity vectors for the point in the quiver plot includes being configured to identify velocity vectors for each of the neighboring points selected in an immediately preceding iteration, and wherein the computer being configured to select or receive selection of the other points further includes being configured to produce a cluster of the candidate points over iterations of the iterative process, and select points on a boundary of the cluster as the other points that with the origin point defines the polygon.

In some example implementations of the method of any preceding example implementation, or any combination of preceding example implementations, capturing the digital image of the scene includes capturing a digital video of the scene including a series of digital images, and wherein uploading the digital image of the scene to the computer includes uploading the digital video of the scene to the computer configured to determine the dimensions of the flame in each digital image of the series of digital images, and further configured to determine a change or a rate of change in a dimension of the dimensions of the flame over the series of digital images, the displayable report further including the change in the dimension of the flame.

In some example implementations of the method of any preceding example implementation, or any combination of preceding example implementations, capturing the digital image of the scene includes capturing a digital video of the scene including a series of digital images, and wherein uploading the digital image of the scene to the computer includes uploading the digital video of the scene to the computer configured to determine the dimensions of the flame in each digital image of the series of digital images, and further configured to determine a duration of the flame based on the dimensions of the flame over the series of digital images, the displayable report further including the duration of the flame.

Some example implementations provide a computer for use in testing a battery, the computer comprising a memory configured to store a digital image captured during a test of a battery in which the battery is punctured or heated in a test environment to cause the battery to produce a fire having a flame that extends out from the battery, the digital image being of a scene that includes at least a portion of the test environment and the flame that extends out from the battery, the digital image being captured using a digital camera that forms the digital image using visible light where the digital camera is positioned external to the test environment; and a processor coupled to the memory and programmed to access the digital image and determine dimensions of the flame in the scene based thereon, including the processor being programmed to at least: produce a quiver plot of the scene from the digital image, the quiver plot including a plurality of velocity vectors that represent motion of gases in the scene, the motion of gases including motion of gases in and around the flame, the plurality of velocity vectors originating at a respective plurality of points in the quiver plot and having respective magnitudes and directions; identify a point of the respective plurality of points as an origin point to represent an origin of the flame in the scene; select or receive selection of other points of the respective plurality of points based on similarity of at least the directions of the velocity vectors originating at the origin point and the other points, the origin point and the other points defining a polygon in the quiver plot that is an approximate outline of the flame; determine dimensions of the polygon in the quiver plot; translate the dimensions of the polygon in the quiver plot to corresponding dimensions of a polygon in the digital image; translate the corresponding dimensions of the polygon in the digital image to dimensions of the flame in the scene; and generate a displayable report that includes at least the dimensions of the flame.

In some example implementations of the computer of any preceding example implementation, or any combination of preceding example implementations, the battery in the test environment includes the battery between the digital camera and a fixed background within a back region of the test environment, and the digital image of the scene includes at least a portion of the fixed background and the flame that extends out from the battery.

In some example implementations of the computer of any preceding example implementation, or any combination of preceding example implementations, the processor is programmed to further convert the digital image from color to black-and-white before the quiver plot is produced from the digital image.

In some example implementations of the computer of any preceding example implementation, or any combination of preceding example implementations, the processor is programmed to further identify as abnormal any velocity vectors of the plurality of velocity vectors based on at least a threshold dissimilarity of at least the directions of the velocity vectors and neighboring velocity vectors in the quiver plot; construct new velocity vectors for the velocity vectors identified as abnormal from an interpolation of the neighboring velocity vectors; and replace the velocity vectors identified as abnormal with the new velocity vectors, the velocity vectors identified as abnormal being replaced before the origin point is identified and the other points are selected.

In some example implementations of the computer of any preceding example implementation, or any combination of preceding example implementations, the processor being programmed to select or receive selection of the other points includes being programmed to perform an iterative process in which a first iteration includes the processor being programmed to at least identify for a point in the quiver plot that in the first iteration is the origin point, a velocity vector originating at a neighboring point that is most similar in at least direction to a velocity vector originating at the point; and select the neighboring point as one of the other points that defines the polygon in the quiver plot, wherein in each of at least some iterations of the iterative process after the first iteration, the point in the quiver plot is the neighboring point selected in an immediately preceding iteration, and the processor being programmed to identify the velocity vector excludes the velocity vector originating at the point in the immediately preceding iteration.

In some example implementations of the computer of any preceding example implementation, or any combination of preceding example implementations, the processor being programmed to select or receive selection of the other points includes being programmed to perform an iterative process in which a first iteration includes the processor being programmed to at least identify for a point in the quiver plot that in the first iteration is the origin point, velocity vectors originating at neighboring points that have at least a threshold similarity of at least direction to a velocity vector originating at the point; and select the neighboring points as candidate points, wherein in each of at least some iterations of the iterative process after the first iteration, the processor being programmed to identify velocity vectors for the point in the quiver plot includes being programmed to identify velocity vectors for each of the neighboring points selected in an immediately preceding iteration, and wherein the processor being programmed to select or receive selection of the other points further includes being programmed to produce a cluster of the candidate points over iterations of the iterative process, and select points on a boundary of the cluster as the other points that with the origin point defines the polygon.

In some example implementations of the computer of any preceding example implementation, or any combination of preceding example implementations, memory being configured to store the digital image of the scene includes being configured to store a digital video of the scene including a series of digital images, and wherein the processor is programmed to access the digital video of the scene and determine the dimensions of the flame in each digital image of the series of digital images, and further programmed to determine a change or a rate of change in a dimension of the dimensions of the flame over the series of digital images, the displayable report further including the change in the dimension of the flame.

In some example implementations of the computer of any preceding example implementation, or any combination of preceding example implementations, memory being configured to store the digital image of the scene includes being configured to store a digital video of the scene including a series of digital images, and wherein the processor is programmed to access the digital video of the scene and determine the dimensions of the flame in each digital image of the series of digital images, and further programmed to determine a duration of the flame based on the dimensions of the flame over the series of digital images, the displayable report further including the duration of the flame.

Some example implementations provide a computer-readable storage medium for use in testing a battery, the computer-readable storage medium being non-transitory and having computer-readable program code stored therein that in response to execution by a processor, causes a computer to at least access a digital image captured during a test of a battery in which the battery is punctured or heated in a test environment to cause the battery to produce a fire having a flame that extends out from the battery, the digital image being of a scene that includes at least a portion of the test environment and the flame that extends out from the battery, the digital image being captured using a digital camera that forms the digital image using visible light where the digital camera is positioned external to the test environment; and determine dimensions of the flame in the scene based on the digital image, including the computer being caused to at least: produce a quiver plot of the scene from the digital image, the quiver plot including a plurality of velocity vectors that represent motion of gases in the scene, the motion of gases including motion of gases in and around the flame, the plurality of velocity vectors originating at a respective plurality of points in the quiver plot and having respective magnitudes and directions; identify a point of the respective plurality of points as an origin point to represent an origin of the flame in the scene; select or receive selection of other points of the respective plurality of points based on similarity of at least the directions of the velocity vectors originating at the origin point and the other points, the origin point and the other points defining a polygon in the quiver plot that is an approximate outline of the flame; determine dimensions of the polygon in the quiver plot; translate the dimensions of the polygon in the quiver plot to corresponding dimensions of a polygon in the digital image; translate the corresponding dimensions of the polygon in the digital image to dimensions of the flame in the scene; and generate a displayable report that includes at least the dimensions of the flame.

In some example implementations of the computer-readable storage medium of any preceding example implementation, or any combination of preceding example implementations, the battery in the test environment includes the battery between the digital camera and a fixed background within a back region of the test environment, and the digital image of the scene includes at least a portion of the fixed background and the flame that extends out from the battery.

In some example implementations of the computer-readable storage medium of any preceding example implementation, or any combination of preceding example implementations, the computer-readable storage medium has computer-readable program code stored therein that in response to execution by the processor, causes the computer to further convert the digital image from color to black-and-white before the quiver plot is produced from the digital image.

In some example implementations of the computer-readable storage medium of any preceding example implementation, or any combination of preceding example implementations, the computer-readable storage medium has computer-readable program code stored therein that in response to execution by the processor, causes the computer to further identify as abnormal any velocity vectors of the plurality of velocity vectors based on at least a threshold dissimilarity of at least the directions of the velocity vectors and neighboring velocity vectors in the quiver plot; construct new velocity vectors for the velocity vectors identified as abnormal from an interpolation of the neighboring velocity vectors; and replace the velocity vectors identified as abnormal with the new velocity vectors, the velocity vectors identified as abnormal being replaced before the origin point is identified and the other points are selected.

In some example implementations of the computer-readable storage medium of any preceding example implementation, or any combination of preceding example implementations, the computer being caused to select or receive selection of the other points includes being caused to perform an iterative process in which a first iteration includes the computer being caused to at least identify for a point in the quiver plot that in the first iteration is the origin point, a velocity vector originating at a neighboring point that is most similar in at least direction to a velocity vector originating at the point; and select the neighboring point as one of the other points that defines the polygon in the quiver plot, wherein in each of at least some iterations of the iterative process after the first iteration, the point in the quiver plot is the neighboring point selected in an immediately preceding iteration, and the computer being programmed to identify the velocity vector excludes the velocity vector originating at the point in the immediately preceding iteration.

In some example implementations of the computer-readable storage medium of any preceding example implementation, or any combination of preceding example implementations, the computer being caused to select or receive selection of the other points includes being caused to perform an iterative process in which a first iteration includes the computer being caused to at least identify for a point in the quiver plot that in the first iteration is the origin point, velocity vectors originating at neighboring points that have at least a threshold similarity of at least direction to a velocity vector originating at the point; and select the neighboring points as candidate points, wherein in each of at least some iterations of the iterative process after the first iteration, the computer being caused to identify velocity vectors for the point in the quiver plot includes being caused to identify velocity vectors for each of the neighboring points selected in an immediately preceding iteration, and wherein the computer being caused to select or receive selection of the other points further includes being caused to produce a cluster of the candidate points over iterations of the iterative process, and select points on a boundary of the cluster as the other points that with the origin point defines the polygon.

In some example implementations of the computer-readable storage medium of any preceding example implementation, or any combination of preceding example implementations, memory being configured to store the digital image of the scene includes being configured to store a digital video of the scene including a series of digital images, and wherein the computer is caused to access the digital video of the scene and determine the dimensions of the flame in each digital image of the series of digital images, and further caused to determine a change or a rate of change in a dimension of the dimensions of the flame over the series of digital images, the displayable report further including the change in the dimension of the flame.

In some example implementations of the computer-readable storage medium of any preceding example implementation, or any combination of preceding example implementations, memory being configured to store the digital image of the scene includes being configured to store a digital video of the scene including a series of digital images, and wherein the computer is caused to access the digital video of the scene and determine the dimensions of the flame in each digital image of the series of digital images, and further caused to determine a duration of the flame based on the dimensions of the flame over the series of digital images, the displayable report further including the duration of the flame.

These and other features, aspects, and advantages of the present disclosure will be apparent from a reading of the following detailed description together with the accompanying drawings, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying drawings which illustrate, by way of example, the principles of some described example implementations.

BRIEF DESCRIPTION OF THE DRAWING(S)

Having thus described example implementations of the disclosure in general terms, reference will now be made to the accompanying drawings, which are not necessarily drawn to scale, and wherein:

DETAILED DESCRIPTION

Figure 1:
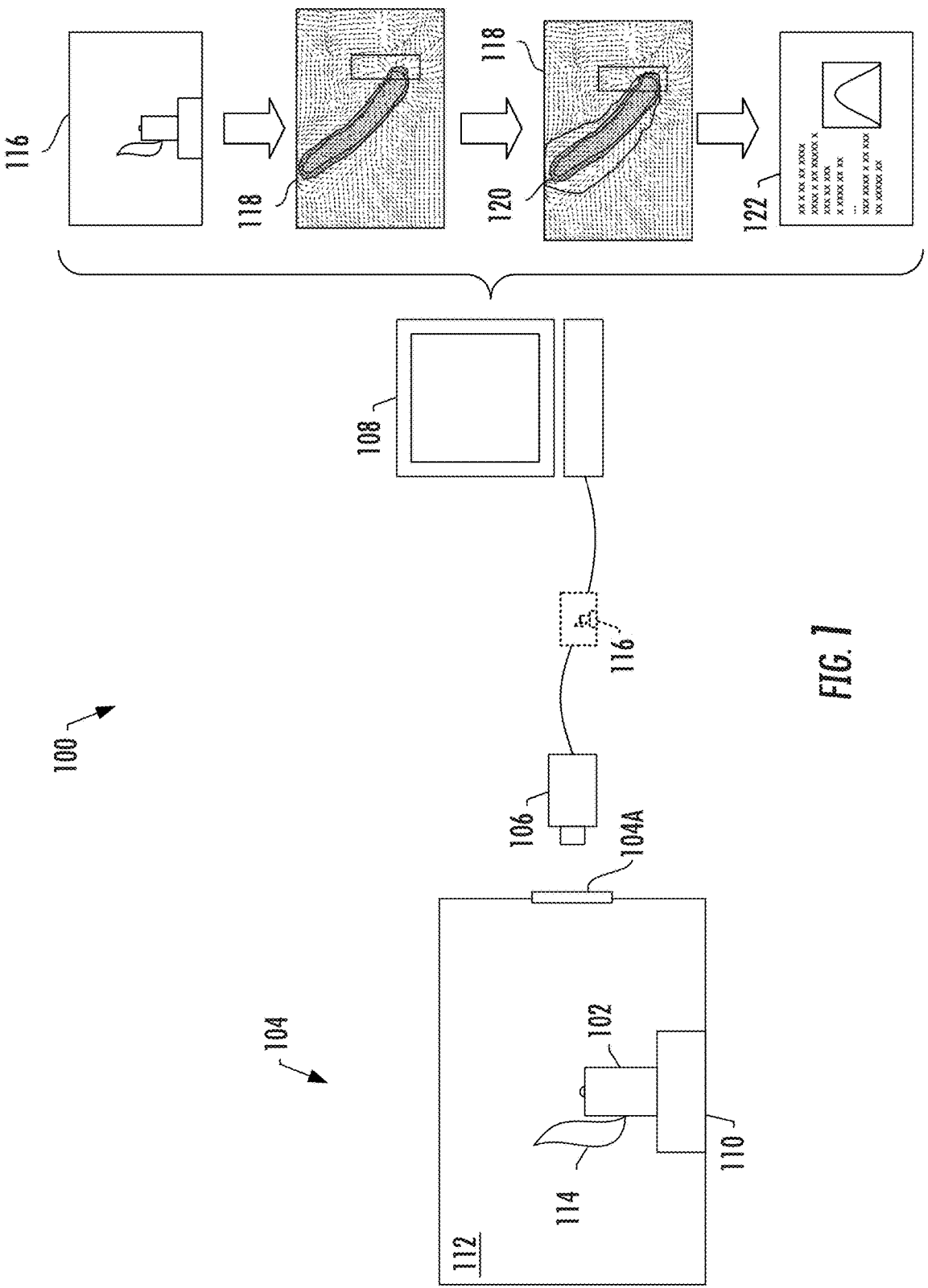
FIG. 1 illustrates a system for testing a battery, according to example implementations of the present disclosure.

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, reference may be made herein to quantitative measures, values, relationships or the like (e.g., planar, coplanar, perpendicular). Unless otherwise stated, any one or more if not all of these may be absolute or approximate to account for acceptable variations that may occur, such as those due to engineering tolerances or the like. Like reference numerals refer to like elements throughout.

Example implementations of the present disclosure are directed to an improved system and method of testing a battery. Example implementations address a number of problems including how to extract meaningful information from images or video of a fire or its flame in an automated manner that captures more of the flame than in prior techniques. Example implementations enable the study of flames in situations where thermal cameras are unable to film, and to understand flame and heat without special-purpose sensors. By capturing a flame instead of placing sensors into the testing chamber, example implementations reduce the likelihood of error created by sensors interfering with the experiment.

Example implementations of the present disclosure are applicable to a number of different battery tests, such as those in which a battery is punctured (a puncture test) or heated (an overheat test). A puncture test can vary on how much the battery is damaged (e.g., dent, partial puncture, puncture through all layers), what punctures the battery (e.g., puncture rod with step-motor driver), and the state of charge of the battery prior to the experiment (e.g., 50% charged, 100% charged). An overheat test can vary on the type of heating patch or wire on the battery, the temperature the battery is heated to, and the state of charge of the battery prior to test.

Example implementations are generally applicable to any battery test in which a digital camera can record either being present in the test environment or through a viewing window. The digital camera may be used to capture air distorted by gases being released from the battery, smoke, and additionally the complete flame plume. Example implementations focus on capturing the entire flame plume, something that previously required a thermal camera.

FIG. 1 illustrates a system 100 for testing a battery 102, according to example implementations of the present disclosure. As shown, the system includes a test environment 104, in which the battery is setup, a digital camera 106 positioned external to the test environment and a computer 108. The test environment in which the battery is contained may be constructed or arranged in any of a number of different manners to support the battery and the test, and as appropriate, to isolate the battery from the external surroundings around the test environment.

In some examples, the test environment 104 includes a support 110 on which the battery 102 is setup. In some examples, the battery is setup in the test environment between the digital camera 106 and a fixed (i.e., non-moving) background 112 in the test environment, such as a wall or metal plate, and which may be solid or patterned. And in some examples, the test environment includes a test chamber in which the battery is setup to isolate the battery, and this test chamber may include a viewing window 104A through which the digital camera setup outside the test chamber may capture images or video within the test chamber. The test environment may also include other components such as a motorized puncture rod to puncture the battery, a heating patch or wire to heat the battery, a voltmeter or other suitable equipment for monitoring voltage of the battery, and the like.

In some examples, the test environment 104 includes or is in an environment that includes a light source that may improve data collection and prevent error, and setup of the battery 102 and test procedure may include adjustment of the test environment or light source to reduce glare on any metallic surfaces, and reduce light shining directly into the digital camera 106. One example of a suitable light source is one that lights the test environment at a constant rate. But in some examples, the battery testing may be performed under minimum lighting conditions (e.g., one small light source in a dark testing chamber), outside in sunlight, or even in darkness depending on the intensity of the flame produced by the battery.

The digital camera 106 is a digital camera that forms digital images or video using visible light, as opposed to forming digital images or video using infrared radiation. In some examples, the digital camera may be capable of forming different digital images or video using electromagnetic radiation in different bands (e.g., visible light, infrared), although the digital images or video used in example implementations are formed using visible light. This is a more common type of digital camera, suitable examples of which are the action cameras developed by GoPro, Inc.

In operation, the battery 102 is setup in the test environment 104 (e.g., on the support 110) in which the battery is punctured or heated to cause the battery to produce a fire having a flame 114 that extends out from the battery. The digital camera positioned external to the test environment is used to capture a digital image 116 (formed using visible light) of a scene that includes at least a portion of the test environment and the flame that extends out from the battery. In some examples in which the battery is setup between the digital camera and a fixed background 112 within a back region of the test environment, the digital image of the scene includes at least a portion of the fixed background and the flame that extends out from the battery.

In some examples, the digital camera 106 is disposed outside the test environment and placed so that it will capture digital images of the scene that includes the battery and a substantial portion of the test environment 104 above and around the battery. If the battery's flame 114 extends past the scene, it may not be possible to characterize the entire flame. The edges of the scene may be treated as cut offs of the flame. In some examples, the computer 108 may be configured to extrapolate and predict how air is moving in the area outside of the scene, although the accuracy of such extrapolation depends on the amount of the flame outside the scene and decreases as the edge of the flame extends further away from the edge of the scene.

The digital image 116 of the scene is uploaded from the digital camera (directly or indirectly) to the computer 108, which is configured to process data associated with the digital image to determine dimensions of the flame in the scene based on the digital image. Examples of suitable dimensions of the flame include its length, its width, and/or the angle from which the flame extends out from the battery.

More particularly, the computer 108 is configured to process data associated with the digital image 116 and to produce a quiver plot 118 of the scene from the digital image, which in some examples is converted from color to black-and-white beforehand. The quiver plot may be produced in any of a number of different manners. In some examples, the computer is configured to produce the quiver plot using or using techniques similar to publicly-available tools such as MATLAB from MathWorks, Inc., a script for tracking refraction wiggles developed at Massachusetts Institute of Technology (MIT) and described in Xue et al., *Refraction Wiggles for Measuring Fluid Depth and Velocity from Video* (2014), and the like. The quiver plot includes a plurality of velocity vectors (e.g., Euclidean vectors) generated based on refraction analysis techniques that represent motion of gases in the scene including motion of gases in and around the flame 112. The plurality of velocity vectors originate at a respective plurality of points in the quiver plot and each have respective magnitudes and directions. In some examples, the quiver plot may be represented in the computer as, or the computer may convert the quiver plot to, a block matrix formed of submatrices each of which correspond to a point on the quiver plot and includes components (u, v) at a respective point (x, y).

In some tests, battery matter may splatter into the field of view of the digital camera 106, such as onto a viewing window 104A of a test chamber in which the battery 102 is setup. This splatter may create a blackout spot in the digital image 116 and correspondingly the quiver plot 118 that may complicate analysis of the quiver plot. In some example implementations, then, the computer is configured to identify and remove such blackout spots and other anomalies in the quiver plot. In some example implementations, these anomalies may be user selected on a display of the quiver plot. Alternatively, the computer may receive user selection of anomalies and remove them in the quiver plot.

In some examples, the computer 108 is configured to identify as abnormal any dissimilar velocity vectors of the plurality of velocity vectors based on at least a threshold dissimilarity of at least the directions of the velocity vectors and neighboring velocity vectors in the quiver plot 118. In these examples, the computer is configured to construct new velocity vectors for the velocity vectors identified as abnormal from an interpolation of the neighboring velocity vectors, and replace the velocity vectors identified as abnormal with the new velocity vectors. This replacement of abnormal velocity vectors may take place at any of a number of points in the process of determining dimensions of the flame 112, but in some examples, the velocity vectors identified as abnormal are replaced before points are selected from it, as described below.

The computer 108 is configured to identify, as near to the source of the flame, a point of the respective plurality of points in the quiver plot 118 as an origin point to represent an origin of the flame 112 in the scene. The computer is configured to select or receive selection of other provisionally relevant points of the respective plurality of points in the quiver plot based on similarity of at least the directions of the velocity vectors originating at the origin point and the other points. The origin point and the other provisionally relevant points in the quiver plot generally define a polygon 120 over a portion of the quiver plot that is an approximate outline of the flame, and the computer is configured to determine dimensions of the polygon in the quiver plot. The computer is configured to translate the dimensions of the polygon in the quiver plot to corresponding dimensions of a polygon in the digital image 116, and translate the corresponding dimensions of the polygon in the digital image to dimensions of the flame in the scene, such as using pixel-per-metric values, that are ratios of pixels to a supplied metric. The computer is further configured to generate a displayable report 120 that includes at least the dimensions of the flame, which may be transmitted or output as a test data file for purposes of certification of the battery.

In some examples, the computer 108 being configured to select or receive selection of the other points includes being configured to perform an iterative process. In this iterative process, a first iteration includes the computer being configured to identify for a point in the quiver plot 118 that in the first iteration is the origin point (e.g., 302 in FIGS. 3A and 3B), and identify a velocity vector originating at a neighboring point (e.g., 304) that is most similar in at least direction to a velocity vector originating at the origin point. The computer is configured to select the neighboring point as one of the other relevant points that together define the polygon 120 in the quiver plot. In each of at least some subsequent iterations of the iterative process after the first iteration, then, the next point identified in the quiver plot is one of the points neighboring the previous point selected in an immediately preceding iteration that is most similar in at least direction to the previously selected point (or origin point), where the computer being configured to identify the velocity vector at a neighboring point excludes selection of the velocity vector originating at the previously selected point in the immediately preceding iteration.

In some examples, the first iteration of the iterative process includes the computer 108 being configured to identify for a point in the quiver plot 118 that in the first iteration is the origin point, velocity vectors originating at neighboring points that have at least a threshold similarity of at least direction to a velocity vector originating at the point. In these examples, the computer is configured to select the neighboring points as candidate points. In each of at least some subsequent iterations of the iterative process after the first iteration, the computer being configured to identify velocity vectors for the point in the quiver plot includes being configured to identify velocity vectors for each of the points neighboring the previous point selected in an immediately preceding iteration, and to identify a neighboring point that is most similar in at least direction to the previously selected point (or origin point). This may comprises identifying a point that has a threshold of similarity (e.g., direction within 10 degrees) to be selected as a candidate point. The computer being configured to select or receive selection of the other candidate points, then, further includes being configured to produce a cluster of the candidate points over iterations of the iterative process, and select points on a boundary of the cluster as the other relevant points that with the origin point defines the polygon 120.

In some examples, through computer vision methods, the computer 108 may be configured to perform edge detection on the velocity vectors, and then apply dilations and erosions to close any gaps between the detected edges. This forms an edge map, which the computer may then use through the application of a clustering method to identify polygon candidates. The clustering method may use the heading of the edges as feature. The computer may compute a number of contours, based on the clusters. Subsequently, the computer may loop over the contours and automatically pick appropriate polygons by the geometrical sizes. The computer may order the points in the chosen polygons such that they appear in top-left, top-right, bottom-right, and bottom-left order, and then draw the outlines based on these ordered points and forms bounding boxes. Each polygon may be contained by each bounding box, which the computer may unpack and compute the midpoint between the top-left and top-right coordinates, followed by the midpoint between bottom-left and bottom-right coordinates. Using these midpoints, the computer may compute the Euclidean distance. The computer has access to a pixels-per-metric value that is a ratio of pixels to a supplied metric (that may be a unit of length measure). The dimensions of the polygon in the quiver plot may then be translated by performing arithmetic using the Euclidean distances and tuned pixels-per-metric values.

In some examples, the digital camera 106 is configured to capture a digital video of the scene including a series of digital images. In at least some of these examples, the computer 108 is configured to determine the dimensions of the flame 112 in each digital image of the series of digital images, and further determine a change or a rate of change in a dimension (e.g., length, width, angle) of the dimensions of the flame over the series of digital images. A rate in change of the flame's length in some examples may be construed as a measure of the flame's velocity, and it may be determined using the change in length and frame rate of the digital video.

Additionally or alternatively, in some examples, the computer 108 is configured to determine a duration of the flame based on the dimensions of the flame over the series of digital images. The duration of the flame in some examples may be defined as the time between the first digital image in which the length of the flame is detectable and/or determinable, through its maximum length and back to the last digital image in which the length is determinable. Here, the time between the first and last digital images may be determined from the frame rate and the number of frames from the first to the last frame. In these examples, the displayable report 120 further includes the change in the dimension of the flame, and/or the duration of the flame.

To illustrate the determination of a duration of flame, the digital image 116 in FIG. 1 may represent the first digital image in a series of digital images in which the computer 108 detects the presence or length of a flame, which flame may expand over time to the extent shown in the quiver plot 118 in FIG. 1. The time elapsed from the first digital image may be determined from the frame rate and the number of frames from the first digital image to the later image. An example timeline may include 1-10 seconds for a motorized puncture rod to puncture the battery 102. Once the battery is punctured, it may have an initial explosion of 4-12 seconds, the chaotic explosions focus may focus into a flame for 1-6 seconds, and the flame may come out of the battery at a recordable rate for 20+ seconds until the flame dies out, over which the flame may change size, position and origin point. This time line may differ based on a number of variables such as cell chemistry/type of cell (size/geometry, state of charge, variation in testing methods and the like.

Figure 2:
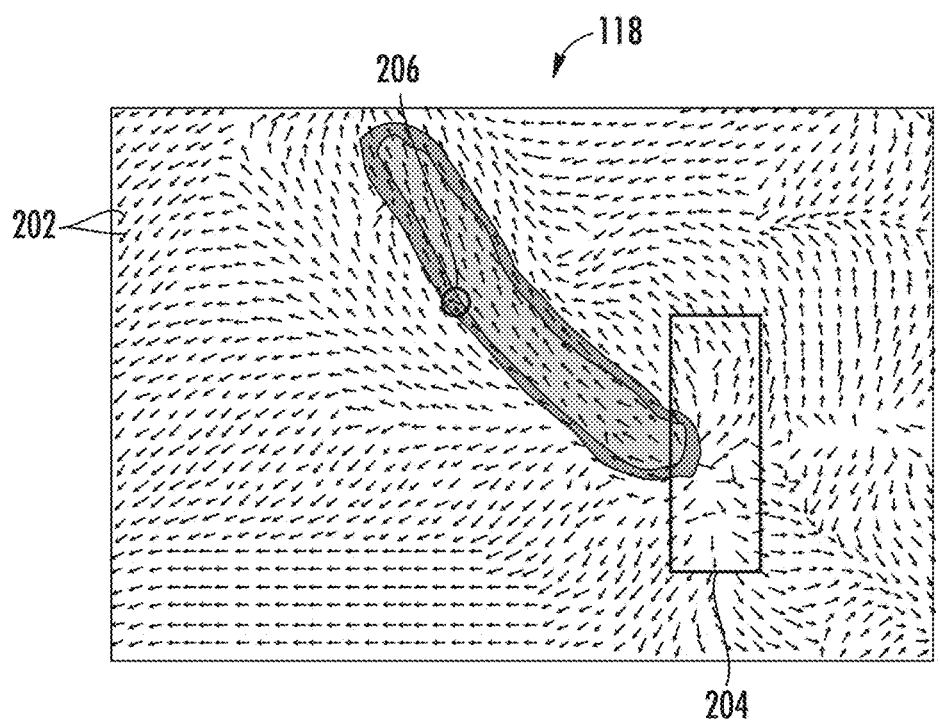
FIGS. 2, 3A, 3B and 4 illustrate a quiver plot according to some example implementations.

To further illustrate various example implementations of the present disclosure, FIG. 2 illustrates a quiver plot 118 according to some examples. As shown, the quiver plot includes a plurality of velocity vectors 202 that represent motion of gases in a scene including motion of gases in and around a flame 112. For illustrative purposes, an outline 204 of the battery 102 in the scene is also shown. FIG. 2 also illustrates a velocity vector 206 that may be identified as abnormal based on its dissimilarity of direction with its neighboring velocity vectors, and replaced with a new velocity vector.

Figure 3A:
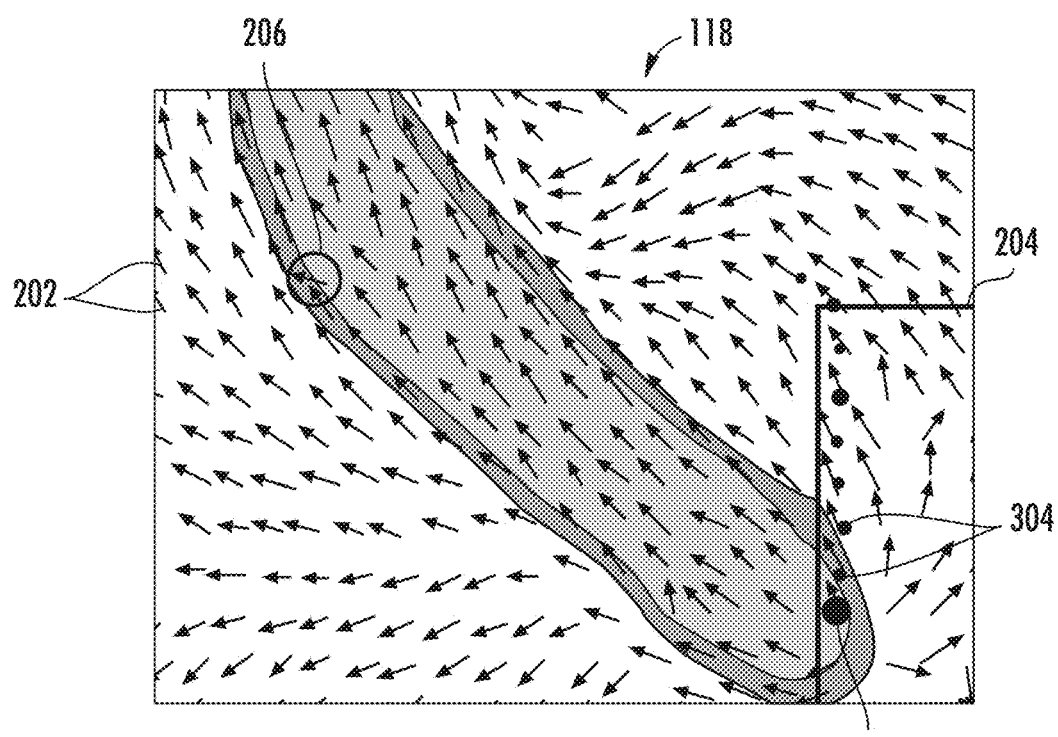
Figure 3B:
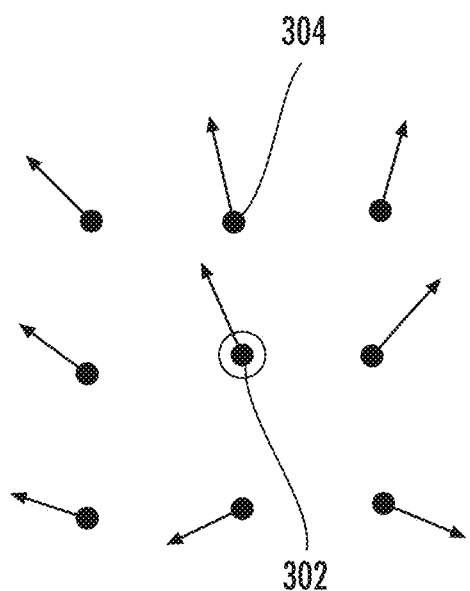

FIGS. 3A and 3B (collectively FIG. 3) are close-up views of the quiver plot 118 in FIG. 2, according to some example implementations. FIG. 3 illustrates points identified or selected to define the polygon 120 that is an appreciate outline of the flame 112. More specifically, FIG. 3 illustrates a point 302 that may be identified as the origin point to represent an origin of the flame in the scene. FIG. 3 also illustrates some of the other points 304 that may be identified based on the similarity of their vectors with the vector at the origin point. The point and other points define the polygon, which is shown on the quiver plot in FIG. 4.

Figure 4:
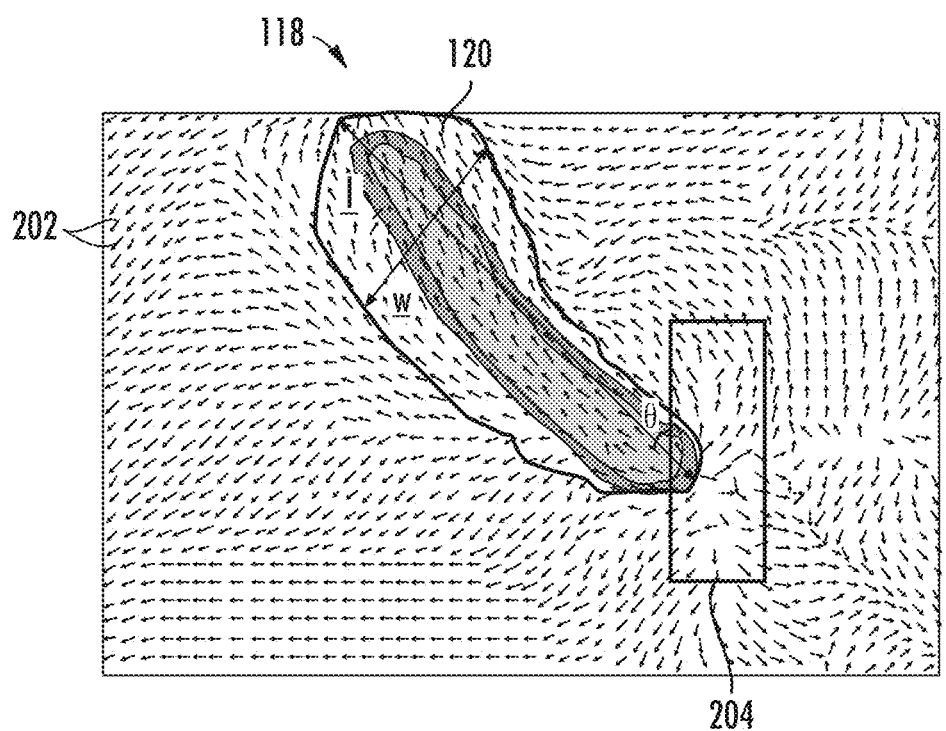

FIG. 4 also illustrates dimensions of the polygon 120 in the quiver plot 118, according to some example implementations. As shown, the length l of the polygon is defined as the longest path between any two points that define the polygon. This path defines the longest line between any two points. The width w of the polygon, then, is defined as the longest path between any two points on a line perpendicular to the longest line. The angle θ from which the flame extends out from the battery 102 is defined as the acute angle between the longest line from which the length is defined, and the battery.

Figure 5:
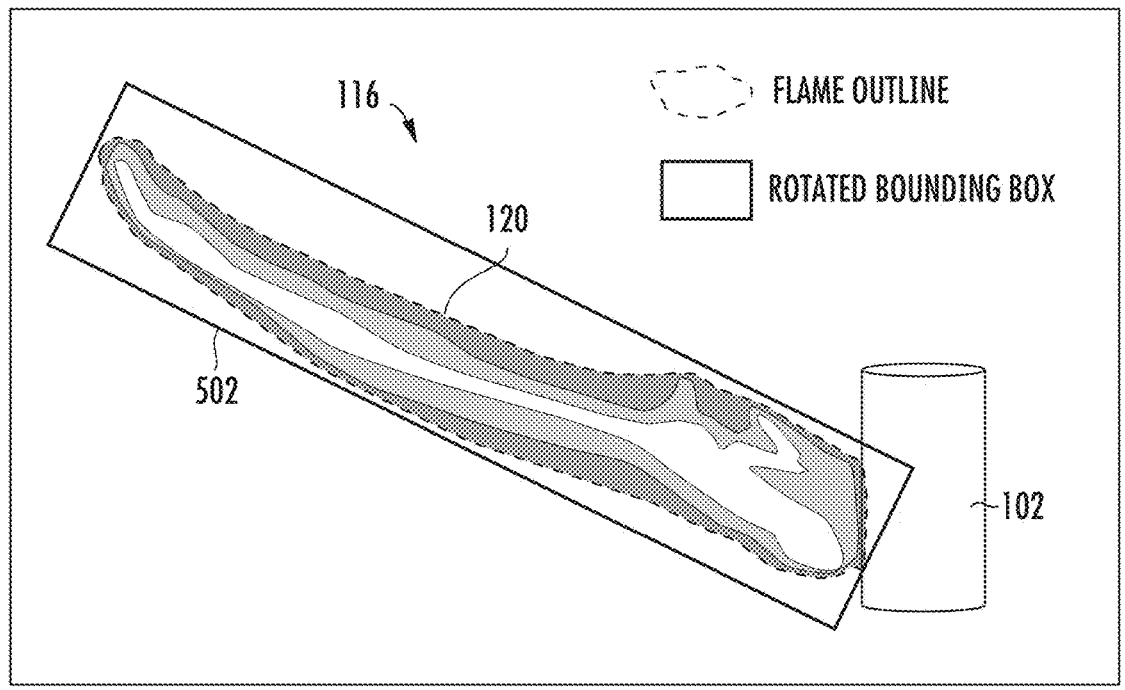
FIGS. 5, 6 and 7 illustrate dimensions of a polygon (flame outline) in a digital image, according to example implementations
Figure 6:
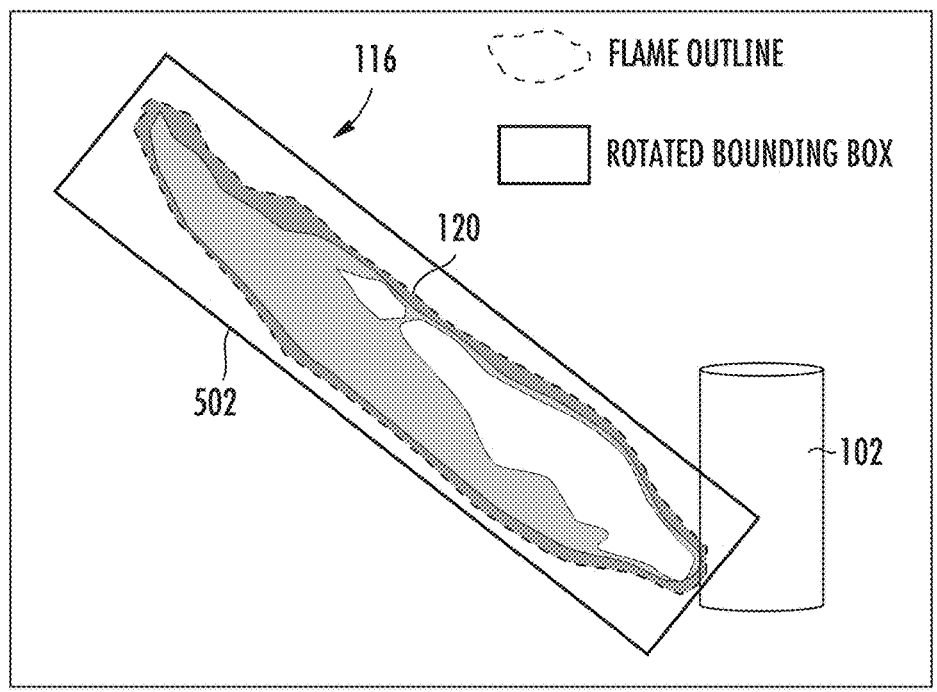
Figure 7:
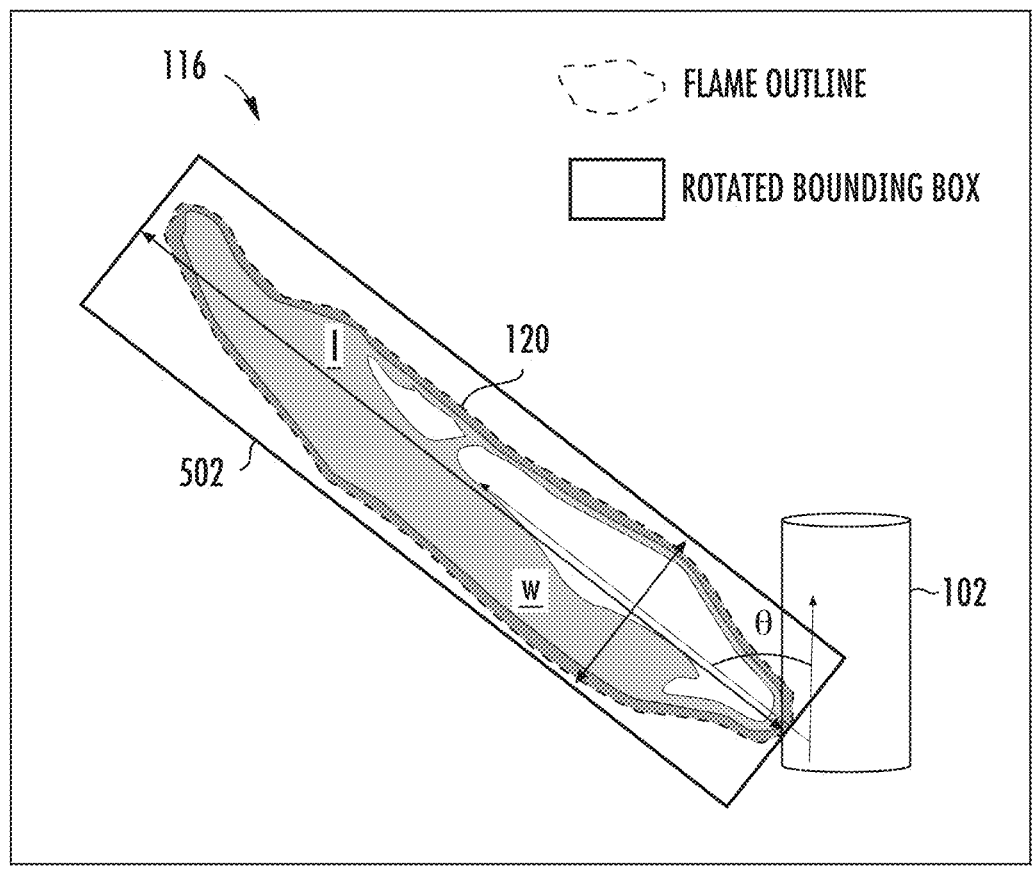

FIGS. 5, 6 and 7 illustrate dimensions of the polygon 120 (flame outline) in the digital image 116, according to example implementations. As shown, in some example implementations, the dimensions of the polygon may be determined according to a minimum bounding box technique in which the dimensions are of a rotated box 502 with the smallest measure within which all the points of the polygon lie. This technique may provide the measurement of the length and width of the bounding box, the four corners (x, y in pixels), and angle of rotation. Although shown for the digital image, the same technique may be applied in the quiver plot 118.

Figure 8:
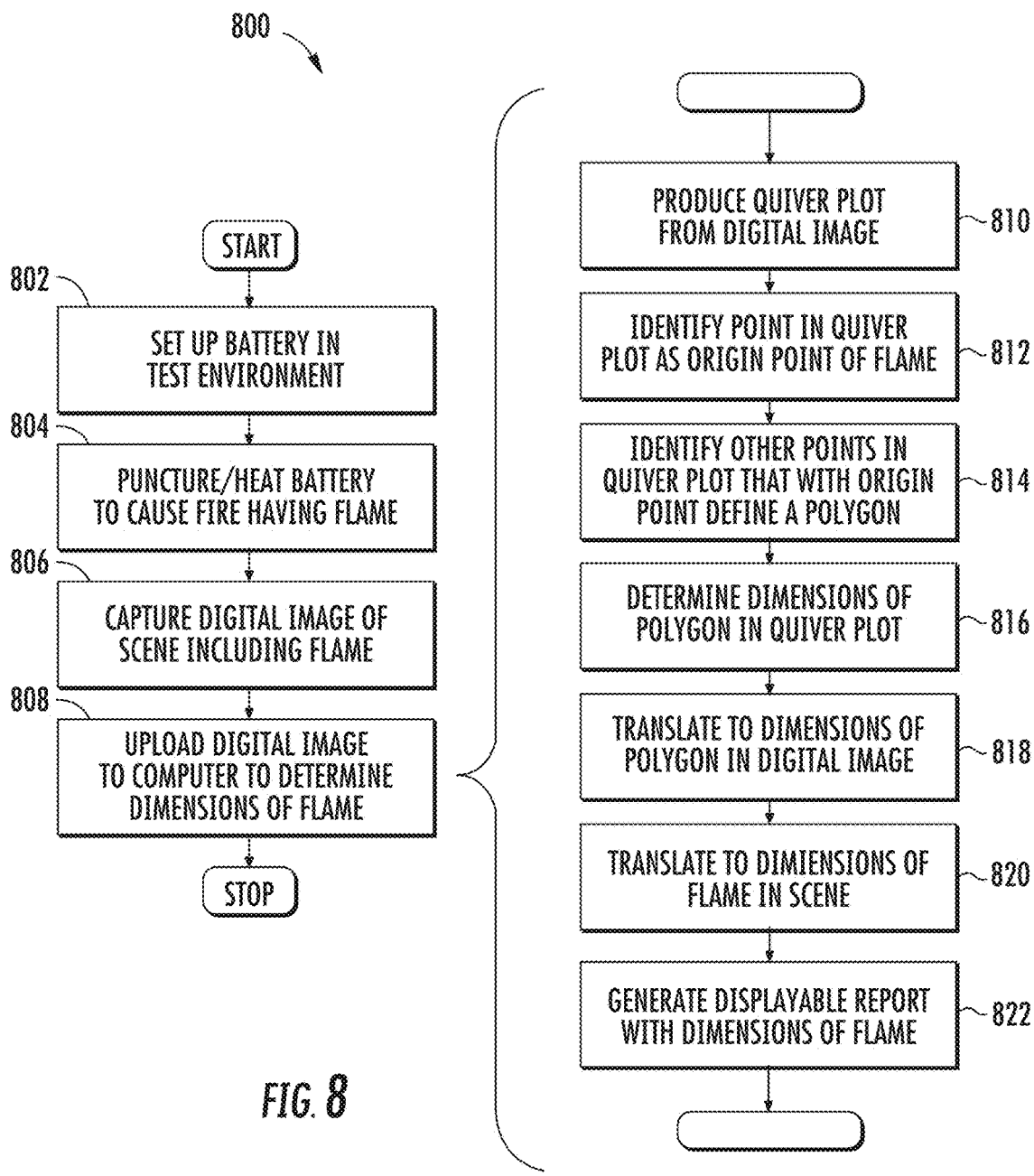
FIG. 8 is a flowchart illustrating various steps in a method of testing a battery, according to various example implementations.

FIG. 8 is a flowchart illustrating various steps in a method 800 of testing a battery 102, according to example implementations of the present disclosure. As shown in blocks 802 and 804, the method includes setting up the battery in a test environment 104, and puncturing or heating the battery in the test environment to cause the battery to produce a fire having a flame 112 that extends out from the battery. The method includes the digital camera 106 capturing a digital image 116 of a scene that includes at least a portion of the test environment and the flame that extends out from the battery, as shown in block 806. And the method includes uploading the digital image of the scene to a computer 108 configured to determine dimensions of the flame in the scene based thereon, as shown in block 808.

As shown in block 810, the computer 108 produces a quiver plot 118 of the scene from the digital image 116. The computer identifies, as near to the source of the flame, a point of the respective plurality of points as an origin point to represent an origin of the flame 112 in the scene, and selects or receives selection of other provisionally relevant points of the respective plurality of points based on similarity of at least the directions of the velocity vectors originating at the origin point and the other points, as shown in blocks 812 and 814. As before, the origin point and the other relevant points define a polygon 120 in the quiver plot that is an approximate outline of the flame, and the computer determines dimensions of the polygon in the quiver plot, as shown in block 816. The computer translates the dimensions of the polygon in the quiver plot to corresponding dimensions of a polygon in the digital image, and translates the corresponding dimensions of the polygon in the digital image to dimensions of the flame in the scene, as shown in blocks 818 and 820. And the computer generates a displayable report 120 that includes at least the dimensions of the flame, as shown in block 822.

According to example implementations of the present disclosure, the computer 108 is generally an electronic device capable of storing, retrieving and processing data. The computer may be implemented by various means. Means for implementing the computer may include hardware, alone or under direction of one or more computer programs from a computer-readable storage medium. In some examples, one or more computers or computing apparatuses may be configured to function as or otherwise implement the computer shown and described herein. In examples involving more than one the computer, the respective the computers may be connected to or otherwise in communication with one another in a number of different manners, such as directly or indirectly via a wired or wireless network or the like.

Figure 9:
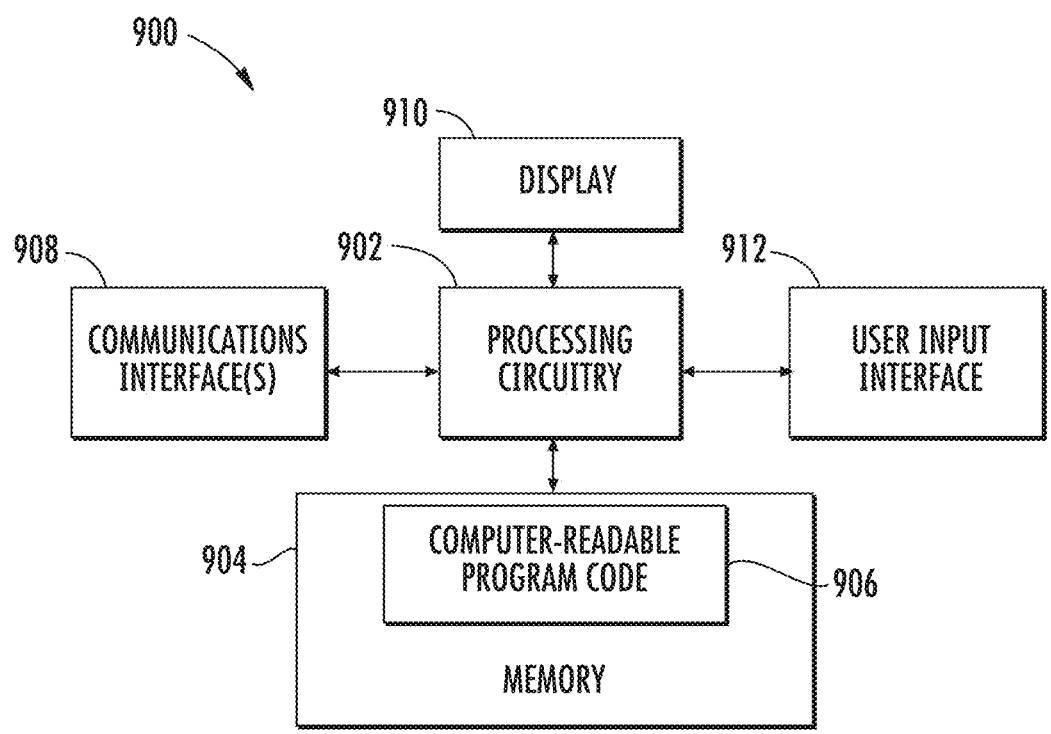
FIG. 9 illustrates a computer according to some example implementations.

FIG. 9 more particularly illustrates the computer 108 according to some example implementations. Generally, the computer of example implementations of the present disclosure may comprise, include or be embodied in one or more fixed or portable electronic devices. Examples of suitable electronic devices include a smartphone, tablet computer, laptop computer, desktop computer, workstation computer, server computer or the like. The computer may include one or more of each of a number of components such as, for example, processor 902 (e.g., processing circuitry) connected to a memory 904 (e.g., storage device).

The processor 902 may be composed of one or more processors alone or in combination with one or more memories. The processor is generally any piece of computer hardware that is capable of processing information such as, for example, data, computer programs and/or other suitable electronic information. The processor is composed of a collection of electronic circuits some of which may be packaged as an integrated circuit or multiple interconnected integrated circuits (an integrated circuit at times more commonly referred to as a "chip"). The processor may be configured to execute computer programs, which may be stored onboard the processor or otherwise stored in the memory 904 (of the same or another computer).

The processor 902 may be a number of processors, a multi-core processor or some other type of processor, depending on the particular implementation. Further, the processor may be implemented using a number of heterogeneous processor systems in which a main processor is present with one or more secondary processors on a single chip. As another illustrative example, the processor may be a symmetric multi-processor system containing multiple processors of the same type. In yet another example, the processor may be embodied as or otherwise include one or more ASICs, FPGAs or the like. Thus, although the processor may be capable of executing a computer program to perform one or more functions, the processor of various examples may be capable of performing one or more functions without the aid of a computer program. In either instance, the processor may be appropriately programmed to perform functions or operations according to example implementations of the present disclosure.

The memory 904 is generally any piece of computer hardware that is capable of storing information such as, for example, data, computer programs (e.g., computer-readable program code 906) and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk-read only memory (CD-ROM), compact disk-read/write (CD-R/W), DVD or the like. In various instances, the memory may be referred to as a computer-readable storage medium. The computer-readable storage medium is a non-transitory device capable of storing information, and is distinguishable from computer-readable transmission media such as electronic transitory signals capable of carrying information from one location to another. Computer-readable medium as described herein may generally refer to a computer-readable storage medium or computer-readable transmission medium.

In addition to the memory 904, the processor 902 may also be connected to one or more interfaces for displaying, transmitting and/or receiving information. The interfaces may include a communications interface 908 (e.g., communications unit) and/or one or more user interfaces. The communications interface may be configured to transmit and/or receive information, such as to and/or from other computer(s), network(s) or the like. The communications interface may be configured to transmit and/or receive information by physical (wired) and/or wireless communications links. Examples of suitable communication interfaces include a network interface controller (NIC), wireless NIC (WNIC) or the like.

The user interfaces may include a display 910 and/or one or more user input interfaces 912 (e.g., input/output unit). The display may be configured to present or otherwise display information to a user, suitable examples of which include a liquid crystal display (LCD), light-emitting diode display (LED), plasma display panel (PDP) or the like. The user input interfaces may be wired or wireless, and may be configured to receive information from a user into the computer, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions may be stored in memory, and executed by processor that is thereby programmed, to implement functions of the systems, subsystems, tools and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, a processor or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processor or other programmable apparatus to configure the computer, processor or other programmable apparatus to execute operations to be performed on or by the computer, processor or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processor or other programmable apparatus provide operations for implementing functions described herein.

Execution of instructions by a processor, or storage of instructions in a computer-readable storage medium, supports combinations of operations for performing the specified functions. In this manner, the computer 108 may include a processor 902 and a computer-readable storage medium or memory 904 coupled to the processor, where the processor is configured to execute computer-readable program code 906 stored in the memory. It will also be understood that one or more functions, and combinations of functions, may be implemented by special purpose hardware-based computer systems and/or processors which perform the specified functions, or combinations of special purpose hardware and program code instructions.

Many modifications and other implementations of the disclosure set forth herein will come to mind to one skilled in the art to which the disclosure pertains having the benefit of the teachings presented in the foregoing description and the associated drawings. Therefore, it is to be understood that the disclosure is not to be limited to the specific implementations disclosed and that modifications and other implementations are intended to be included within the scope of the appended claims. Moreover, although the foregoing description and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method of testing a battery comprising:
setting up the battery in a test environment;
puncturing or heating the battery in the test environment to cause the battery to produce a fire having a flame that extends out from the battery;
capturing a digital image of a scene that includes at least a portion of the test environment and the flame that extends out from the battery, the digital image being captured using a digital camera that forms the digital image using visible light where the digital camera is positioned external to the test environment; and
uploading the digital image of the scene to a computer configured to determine dimensions of the flame in the scene based thereon, including the computer being configured to at least:
produce a quiver plot of the scene from the digital image, the quiver plot including a plurality of velocity vectors that represent motion of gases in the scene, the motion of gases including motion of gases in and around the flame, the plurality of velocity vectors originating at a respective plurality of points in the quiver plot and having respective magnitudes and directions;
identify a point of the respective plurality of points as an origin point to represent an origin of the flame in the scene;
select or receive selection of other points of the respective plurality of points based on similarity of at least the directions of the velocity vectors originating at the origin point and the other points, the origin point and the other points defining a polygon in the quiver plot that is an approximate outline of the flame;
determine dimensions of the polygon in the quiver plot;
translate the dimensions of the polygon in the quiver plot to corresponding dimensions of a polygon in the digital image;
translate the corresponding dimensions of the polygon in the digital image to dimensions of the flame in the scene; and
generate a displayable report that includes at least the dimensions of the flame.

2. The method of claim 1, wherein setting up the battery in the test environment includes setting up the battery between the digital camera and a fixed background within a back region of the test environment, and the digital image of the scene includes at least a portion of the fixed background and the flame that extends out from the battery.

3. The method of claim 1, wherein uploading the digital image of the scene to the computer includes uploading the digital image of the scene to the computer configured to further:
convert the digital image from color to black-and-white before the quiver plot is produced from the digital image.

4. The method of claim 1, wherein uploading the digital image of the scene to the computer includes uploading the digital image of the scene to the computer configured to further:
identify as abnormal any velocity vectors of the plurality of velocity vectors based on at least a threshold dissimilarity of at least the directions of the velocity vectors and neighboring velocity vectors in the quiver plot;
construct new velocity vectors for the velocity vectors identified as abnormal from an interpolation of the neighboring velocity vectors; and
replace the velocity vectors identified as abnormal with the new velocity vectors, the velocity vectors identified as abnormal being replaced before the origin point is identified and the other points are selected.

5. The method of claim 1, wherein the computer being configured to select or receive selection of the other points includes being configured to perform an iterative process in which a first iteration includes the computer being configured to at least:
identify for a point in the quiver plot that in the first iteration is the origin point, a velocity vector originating at a neighboring point that is most similar in at least direction to a velocity vector originating at the point; and
select the neighboring point as one of the other points that defines the polygon in the quiver plot,
wherein in each of at least some iterations of the iterative process after the first iteration, the point in the quiver plot is the neighboring point selected in an immediately preceding iteration, and the computer being configured to identify the velocity vector excludes the velocity vector originating at the point in the immediately preceding iteration.

6. The method of claim 1, wherein the computer being configured to select or receive selection of the other points includes being configured to perform an iterative process in which a first iteration includes the computer being configured to at least:
identify for a point in the quiver plot that in the first iteration is the origin point, velocity vectors originating at neighboring points that have at least a threshold similarity of at least direction to a velocity vector originating at the point; and
select the neighboring points as candidate points,
wherein in each of at least some iterations of the iterative process after the first iteration, the computer being configured to identify velocity vectors for the point in the quiver plot includes being configured to identify velocity vectors for each of the neighboring points selected in an immediately preceding iteration, and
wherein the computer being configured to select or receive selection of the other points further includes being configured to produce a cluster of the candidate points over iterations of the iterative process, and select points on a boundary of the cluster as the other points that with the origin point defines the polygon.

7. The method of claim 1, wherein capturing the digital image of the scene includes capturing a digital video of the scene including a series of digital images, and
wherein uploading the digital image of the scene to the computer includes uploading the digital video of the scene to the computer configured to determine the dimensions of the flame in each digital image of the series of digital images, and further configured to determine a change or a rate of change in a dimension of the dimensions of the flame over the series of digital images, the displayable report further including the change in the dimension of the flame.

8. The method of claim 1, wherein capturing the digital image of the scene includes capturing a digital video of the scene including a series of digital images, and
  wherein uploading the digital image of the scene to the computer includes uploading the digital video of the scene to the computer configured to determine the dimensions of the flame in each digital image of the series of digital images, and further configured to determine a duration of the flame based on the dimensions of the flame over the series of digital images, the displayable report further including the duration of the flame.

9. A computer for use in testing a battery, the computer comprising:
  a memory configured to store a digital image captured during a test of a battery in which the battery is punctured or heated in a test environment to cause the battery to produce a fire having a flame that extends out from the battery, the digital image being of a scene that includes at least a portion of the test environment and the flame that extends out from the battery, the digital image being captured using a digital camera that forms the digital image using visible light where the digital camera is positioned external to the test environment; and
  a processor coupled to the memory and programmed to access the digital image and determine dimensions of the flame in the scene based thereon, including the processor being programmed to at least:
    produce a quiver plot of the scene from the digital image, the quiver plot including a plurality of velocity vectors that represent motion of gases in the scene, the motion of gases including motion of gases in and around the flame, the plurality of velocity vectors originating at a respective plurality of points in the quiver plot and having respective magnitudes and directions;
    identify a point of the respective plurality of points as an origin point to represent an origin of the flame in the scene;
    select or receive selection of other points of the respective plurality of points based on similarity of at least the directions of the velocity vectors originating at the origin point and the other points, the origin point and the other points defining a polygon in the quiver plot that is an approximate outline of the flame;
    determine dimensions of the polygon in the quiver plot;
    translate the dimensions of the polygon in the quiver plot to corresponding dimensions of a polygon in the digital image;
    translate the corresponding dimensions of the polygon in the digital image to dimensions of the flame in the scene; and
    generate a displayable report that includes at least the dimensions of the flame.

10. The computer of claim 9, wherein the battery in the test environment includes the battery between the digital camera and a fixed background within a back region of the test environment, and the digital image of the scene includes at least a portion of the fixed background and the flame that extends out from the battery.

11. The computer of claim 9, wherein the processor is programmed to further convert the digital image from color to black-and-white before the quiver plot is produced from the digital image.

12. The computer of claim 9, wherein the processor is programmed to further:
  identify as abnormal any velocity vectors of the plurality of velocity vectors based on at least a threshold dissimilarity of at least the directions of the velocity vectors and neighboring velocity vectors in the quiver plot;
  construct new velocity vectors for the velocity vectors identified as abnormal from an interpolation of the neighboring velocity vectors; and
  replace the velocity vectors identified as abnormal with the new velocity vectors, the velocity vectors identified as abnormal being replaced before the origin point is identified and the other points are selected.

13. The computer of claim 9, wherein the processor being programmed to select or receive selection of the other points includes being programmed to perform an iterative process in which a first iteration includes the processor being programmed to at least:
  identify for a point in the quiver plot that in the first iteration is the origin point, a velocity vector originating at a neighboring point that is most similar in at least direction to a velocity vector originating at the point; and
  select the neighboring point as one of the other points that defines the polygon in the quiver plot,
  wherein in each of at least some iterations of the iterative process after the first iteration, the point in the quiver plot is the neighboring point selected in an immediately preceding iteration, and the processor being programmed to identify the velocity vector excludes the velocity vector originating at the point in the immediately preceding iteration.

14. The computer of claim 9, wherein the processor being programmed to select or receive selection of the other points includes being programmed to perform an iterative process in which a first iteration includes the processor being programmed to at least:
  identify for a point in the quiver plot that in the first iteration is the origin point, velocity vectors originating at neighboring points that have at least a threshold similarity of at least direction to a velocity vector originating at the point; and
  select the neighboring points as candidate points,
  wherein in each of at least some iterations of the iterative process after the first iteration, the processor being programmed to identify velocity vectors for the point in the quiver plot includes being programmed to identify velocity vectors for each of the neighboring points selected in an immediately preceding iteration, and
  wherein the processor being programmed to select or receive selection of the other points further includes being programmed to produce a cluster of the candidate points over iterations of the iterative process, and select points on a boundary of the cluster as the other points that with the origin point defines the polygon.

15. The computer of claim 9, wherein memory being configured to store the digital image of the scene includes being configured to store a digital video of the scene including a series of digital images, and
  wherein the processor is programmed to access the digital video of the scene and determine the dimensions of the flame in each digital image of the series of digital images, and further programmed to determine a change or a rate of change in a dimension of the dimensions of the flame over the series of digital images, the displayable report further including the change in the dimension of the flame.

16. The computer of claim 9, wherein memory being configured to store the digital image of the scene includes being configured to store a digital video of the scene including a series of digital images, and
wherein the processor is programmed to access the digital video of the scene and determine the dimensions of the flame in each digital image of the series of digital images, and further programmed to determine a duration of the flame based on the dimensions of the flame over the series of digital images, the displayable report further including the duration of the flame.

17. A computer-readable storage medium for use in testing a battery, the computer-readable storage medium being non-transitory and having computer-readable program code stored therein that in response to execution by a processor, causes a computer to at least:
access a digital image captured during a test of a battery in which the battery is punctured or heated in a test environment to cause the battery to produce a fire having a flame that extends out from the battery, the digital image being of a scene that includes at least a portion of the test environment and the flame that extends out from the battery, the digital image being captured using a digital camera that forms the digital image using visible light where the digital camera is positioned external to the test environment; and
determine dimensions of the flame in the scene based on the digital image, including the computer being caused to at least:
produce a quiver plot of the scene from the digital image, the quiver plot including a plurality of velocity vectors that represent motion of gases in the scene, the motion of gases including motion of gases in and around the flame, the plurality of velocity vectors originating at a respective plurality of points in the quiver plot and having respective magnitudes and directions;
identify a point of the respective plurality of points as an origin point to represent an origin of the flame in the scene;
select or receive selection of other points of the respective plurality of points based on similarity of at least the directions of the velocity vectors originating at the origin point and the other points, the origin point and the other points defining a polygon in the quiver plot that is an approximate outline of the flame;
determine dimensions of the polygon in the quiver plot;
translate the dimensions of the polygon in the quiver plot to corresponding dimensions of a polygon in the digital image;
translate the corresponding dimensions of the polygon in the digital image to dimensions of the flame in the scene; and
generate a displayable report that includes at least the dimensions of the flame.

18. The computer-readable storage medium of claim 17, wherein the battery in the test environment includes the battery between the digital camera and a fixed background within a back region of the test environment, and the digital image of the scene includes at least a portion of the fixed background and the flame that extends out from the battery.

19. The computer-readable storage medium of claim 17, wherein the computer-readable storage medium has computer-readable program code stored therein that in response to execution by the processor, causes the computer to further convert the digital image from color to black-and-white before the quiver plot is produced from the digital image.

20. The computer-readable storage medium of claim 17, wherein the computer-readable storage medium has computer-readable program code stored therein that in response to execution by the processor, causes the computer to further:
identify as abnormal any velocity vectors of the plurality of velocity vectors based on at least a threshold dissimilarity of at least the directions of the velocity vectors and neighboring velocity vectors in the quiver plot;
construct new velocity vectors for the velocity vectors identified as abnormal from an interpolation of the neighboring velocity vectors; and
replace the velocity vectors identified as abnormal with the new velocity vectors, the velocity vectors identified as abnormal being replaced before the origin point is identified and the other points are selected.

21. The computer-readable storage medium of claim 17, wherein the computer being caused to select or receive selection of the other points includes being caused to perform an iterative process in which a first iteration includes the computer being caused to at least:
identify for a point in the quiver plot that in the first iteration is the origin point, a velocity vector originating at a neighboring point that is most similar in at least direction to a velocity vector originating at the point; and
select the neighboring point as one of the other points that defines the polygon in the quiver plot,
wherein in each of at least some iterations of the iterative process after the first iteration, the point in the quiver plot is the neighboring point selected in an immediately preceding iteration, and the computer being programmed to identify the velocity vector excludes the velocity vector originating at the point in the immediately preceding iteration.

22. The computer-readable storage medium of claim 17, wherein the computer being caused to select or receive selection of the other points includes being caused to perform an iterative process in which a first iteration includes the computer being caused to at least:
identify for a point in the quiver plot that in the first iteration is the origin point, velocity vectors originating at neighboring points that have at least a threshold similarity of at least direction to a velocity vector originating at the point; and
select the neighboring points as candidate points,
wherein in each of at least some iterations of the iterative process after the first iteration, the computer being caused to identify velocity vectors for the point in the quiver plot includes being caused to identify velocity vectors for each of the neighboring points selected in an immediately preceding iteration, and
wherein the computer being caused to select or receive selection of the other points further includes being caused to produce a cluster of the candidate points over iterations of the iterative process, and select points on a boundary of the cluster as the other points that with the origin point defines the polygon.

23. The computer-readable storage medium of claim 17, wherein memory being configured to store the digital image of the scene includes being configured to store a digital video of the scene including a series of digital images, and
wherein the computer is caused to access the digital video of the scene and determine the dimensions of the flame in each digital image of the series of digital images, and further caused to determine a change or a rate of change in a dimension of the dimensions of the flame over the series of digital images, the displayable report further including the change in the dimension of the flame.

24. The computer-readable storage medium of claim 17, wherein memory being configured to store the digital image of the scene includes being configured to store a digital video of the scene including a series of digital images, and
wherein the computer is caused to access the digital video of the scene and determine the dimensions of the flame in each digital image of the series of digital images, and further caused to determine a duration of the flame based on the dimensions of the flame over the series of digital images, the displayable report further including the duration of the flame.

* * * * *